United States Patent
Syu et al.

(10) Patent No.: US 11,574,846 B2
(45) Date of Patent: Feb. 7, 2023

(54) GATE FORMATION OF SEMICONDUCTOR DEVICES

(71) Applicant: Taiwan Semiconductor Manufacturing Co., Ltd., Hsin-Chu (TW)

(72) Inventors: Chang-Jhih Syu, Hsinchu (TW); Chih-Hao Yu, Tainan (TW); Chang-Yun Chang, Taipei (TW); Hsiu-Hao Tsao, Hsinchu (TW); Yu-Jiun Peng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 155 days.

(21) Appl. No.: 17/075,313

(22) Filed: Oct. 20, 2020

(65) Prior Publication Data
US 2021/0183713 A1 Jun. 17, 2021

Related U.S. Application Data

(60) Provisional application No. 62/948,269, filed on Dec. 15, 2019.

(51) Int. Cl.
*H01L 21/66* (2006.01)
*H01L 29/423* (2006.01)
(Continued)

(52) U.S. Cl.
CPC ...... *H01L 22/20* (2013.01); *H01L 21/823431* (2013.01); *H01L 21/823456* (2013.01);
(Continued)

(58) Field of Classification Search
CPC ............ H01L 22/20; H01L 21/823431; H01L 21/823456; H01L 29/4236;
(Continued)

(56) References Cited

U.S. PATENT DOCUMENTS

| 8,796,666 B1 | 8/2014 | Huang et al. |
| 8,837,810 B2 | 9/2014 | Chen et al. |

(Continued)

FOREIGN PATENT DOCUMENTS

| KR | 20040093168 | 11/2004 |
| KR | 20150033496 | 4/2015 |

(Continued)

OTHER PUBLICATIONS

X. Zhang et al., "Inline detection for FinFET gate poly footing using e-Tilt metrology," 2018 29th Annual SEMI Advanced Semiconductor Manufacturing Conference (ASMC), 2018, pp. 320-323, doi: 10.1109/ASMC.2018.8373196.

*Primary Examiner* — Monica D Harrison
*Assistant Examiner* — Andre C Stevenson
(74) *Attorney, Agent, or Firm* — Haynes and Boone, LLP

(57) ABSTRACT

A method of controlling gate formation of a semiconductor device includes acquiring a correlation between gate critical dimensions (CDs) and etching recipes for forming gate trenches; measuring a gate CD on a target wafer; determining an etching recipe based on the correction and the measured gate CD; and performing an etching process on the target wafer to form a gate trench with the determined etching recipe.

20 Claims, 17 Drawing Sheets

(51) Int. Cl.
  *H01L 29/66* (2006.01)
  *H01L 21/8234* (2006.01)

(52) U.S. Cl.
  CPC .... *H01L 29/4236* (2013.01); *H01L 29/42376* (2013.01); *H01L 29/66545* (2013.01); *H01L 29/66795* (2013.01)

(58) Field of Classification Search
  CPC ......... H01L 29/42376; H01L 29/66545; H01L 29/66795
  See application file for complete search history.

(56) References Cited

U.S. PATENT DOCUMENTS

| | | | |
|---|---|---|---|
| 9,093,530 | B2 | 4/2015 | Huang et al. |
| 9,134,633 | B2 | 9/2015 | Lin et al. |
| 9,230,867 | B2 | 1/2016 | Cheng et al. |
| 9,304,403 | B2 | 4/2016 | Lin et al. |
| 9,404,743 | B2 | 8/2016 | Chiu et al. |
| 9,548,303 | B2 | 1/2017 | Lee et al. |
| 9,823,585 | B2 | 11/2017 | Shih et al. |
| 9,841,687 | B2 | 12/2017 | Lee et al. |
| 2002/0155629 | A1* | 10/2002 | Fairbairn ............ G03F 7/70625 156/345.31 |
| 2005/0130432 | A1* | 6/2005 | Machala ................. H01L 22/20 438/694 |
| 2008/0183312 | A1* | 7/2008 | Funk ................ G05B 19/41865 700/45 |
| 2012/0253497 | A1* | 10/2012 | Prager ................. H01J 37/3266 257/E21.528 |
| 2013/0260561 | A1 | 10/2013 | Ranjan et al. |
| 2013/0309834 | A1 | 11/2013 | Hsieh et al. |
| 2016/0043001 | A1* | 2/2016 | Kim ................ H01L 21/823418 438/703 |
| 2019/0043963 | A1* | 2/2019 | Baars ................ H01L 21/76897 |
| 2019/0067120 | A1 | 2/2019 | Ching et al. |
| 2021/0036130 | A1* | 2/2021 | Su ................... H01L 21/823821 |

FOREIGN PATENT DOCUMENTS

| | | |
|---|---|---|
| KR | 20170004828 A | 1/2017 |
| KR | 101158950 | 6/2021 |
| TW | 201405668 A | 2/2014 |
| TW | 201830692 A | 8/2018 |
| WO | 2013154842 A1 | 10/2013 |

* cited by examiner

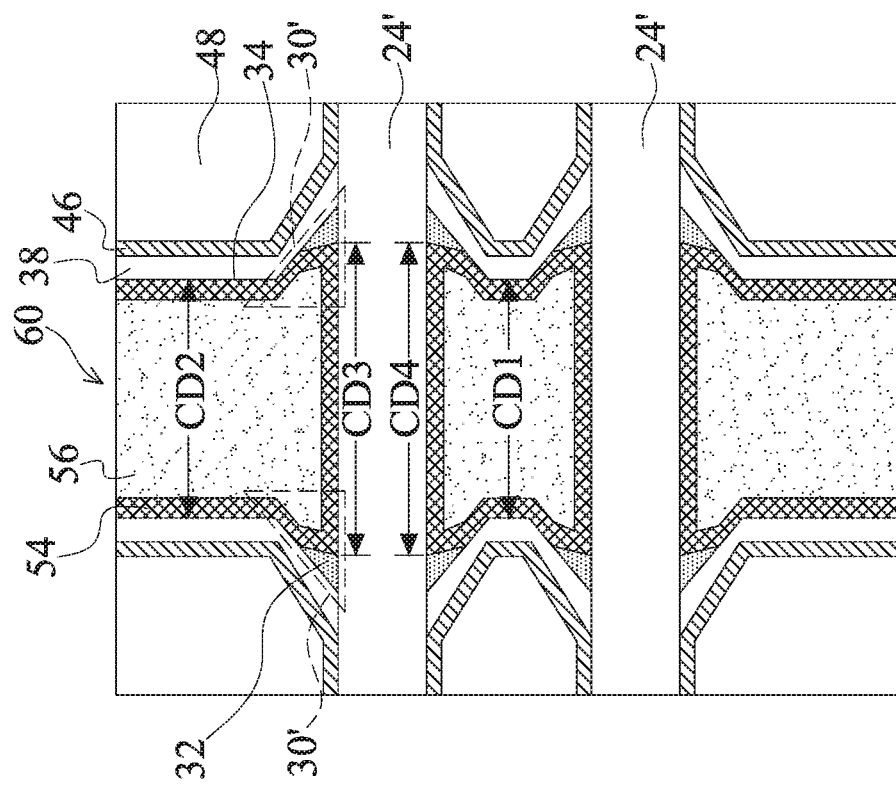
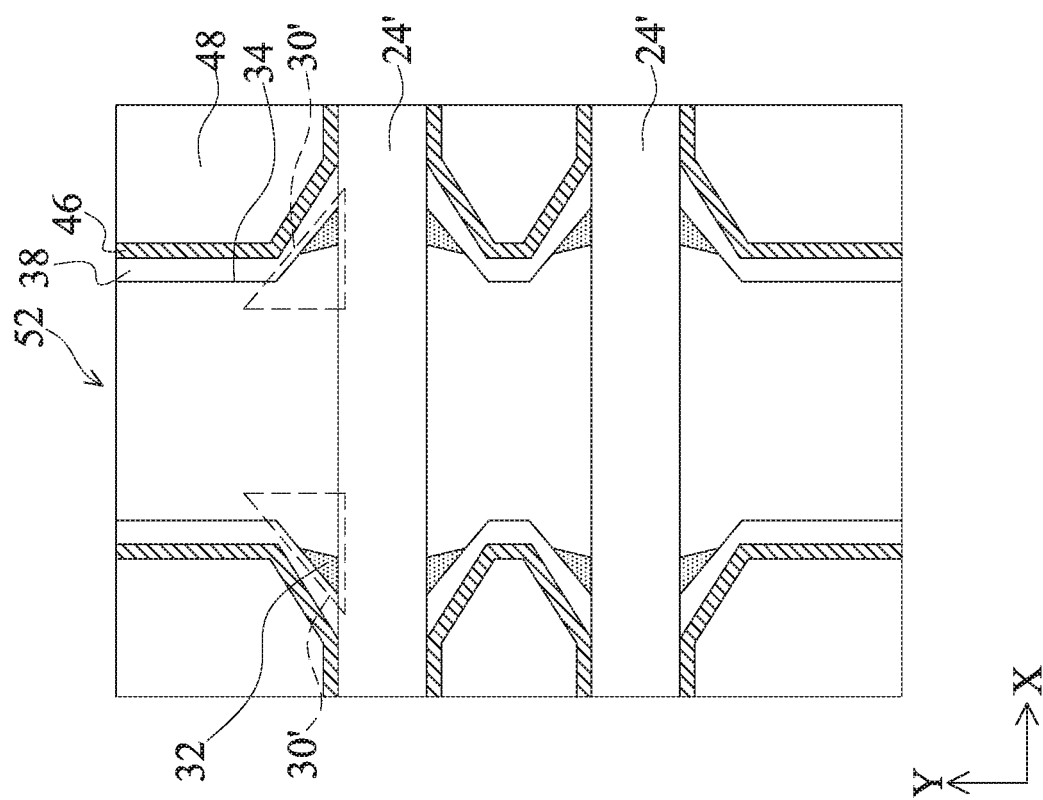
FIG. 10B
FIG. 10A

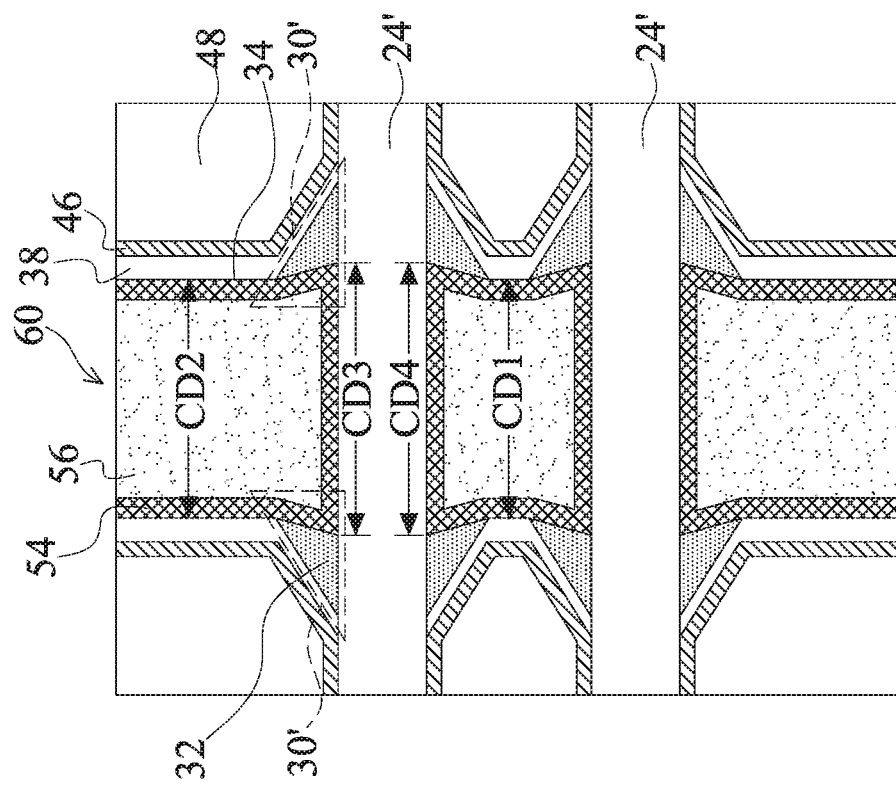
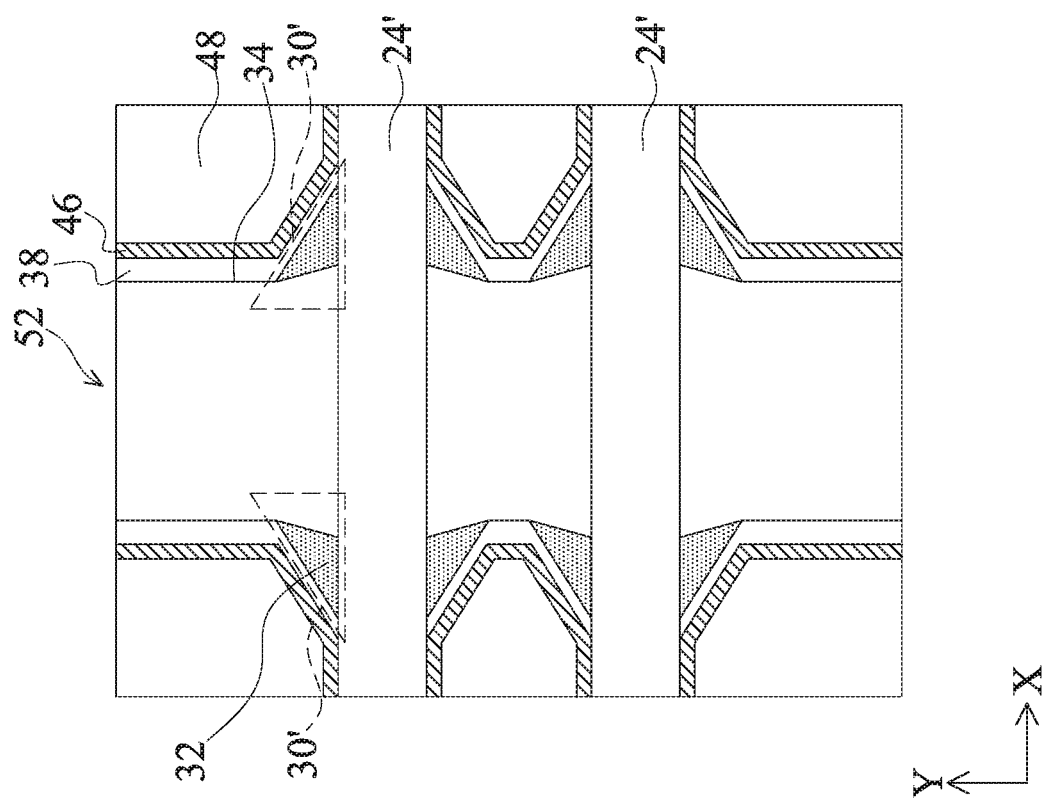
FIG. 11B
FIG. 11A

GATE FORMATION OF SEMICONDUCTOR DEVICES

PRIORITY DATA

This application claims priority to U.S. Provisional Patent Application Ser. No. 62/948,269 filed on Dec. 15, 2019, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

As design rules shrink and process windows (i.e., the margins for error in processing) become smaller, inspection and measurement of critical dimension (CD) of device features as well as their cross-sectional shape ("profile") are becoming increasingly important. Deviations of a feature's critical dimension and profile from design dimensions may adversely affect the performance of the finished semiconductor device. Furthermore, the measurement of a feature's critical dimension and profile may indicate processing problems. Thus, critical dimension and profile values, especially gate CDs and gate profiles, and their variation from design dimensions, are important indicators of the accuracy and stability of the manufacturing processes. For example, drive current of transistors is sensitive to gate CDs and gate profiles. Hence stability of controlling gate formation contributes to overall chip performance improvement.

Although equipment is available for measuring gate CDs and profiles, such equipment generally does not provide immediate feedback to lithography steps to reduce variations, and the results of conventional inspections are not typically used to adjust subsequent etch processing. Furthermore, due to process variations, gate CDs and profile may be affected by factors unknown to designers, making it difficult to have a universal setting for process control. Therefore, there exists a need for a simple and cost-effective system and methodology for gate formation control without a significant reduction in production throughput.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 6B, 8, 9A, 9B, 10A, 10B, 11A, and 11B illustrate cross-sectional views of a semiconductor structure, in accordance with some embodiments.

DETAILED DESCRIPTION

Figure 1:
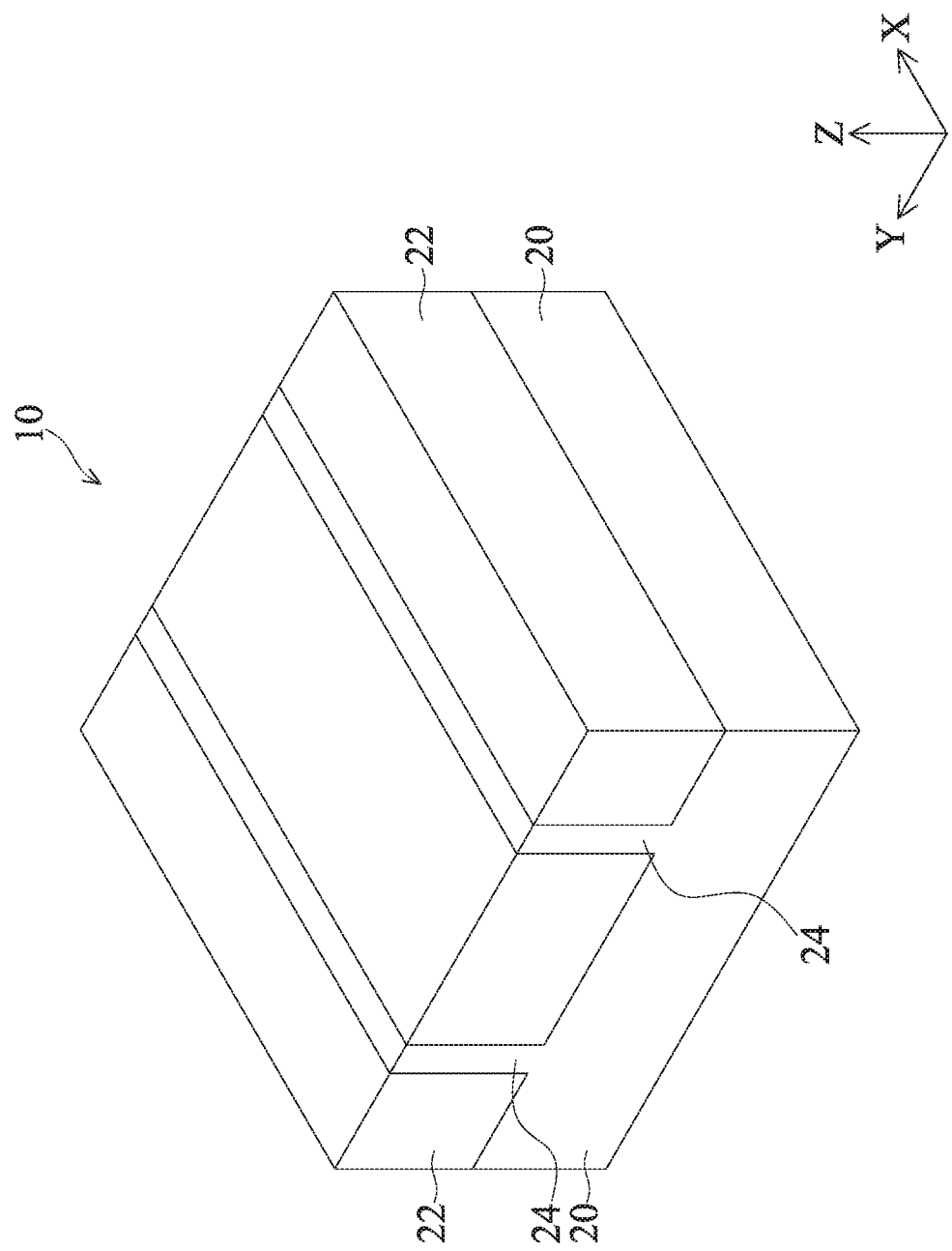
FIGS. 1, 2, 3, 4, 5A, 5B, and 6A illustrate perspective views of intermediate stages in the formation of a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods. More particularly, the present disclosure is related to providing a gate profile characterization method and a gate fabrication technique that provides better control of gate critical dimensions (CDs) and accordingly better yield rate. In the forming of field effect transistors (FETs), gate CDs affect many operating parameters of integrated circuits, such as speed performance and power consumption of a circuit. Generally, a larger gate CD provides stronger control in driving currents of FETs and hence better transistor performance control. On the other hand, a large gate CD reduces distances between gate stacks and source/drain (S/D) metal contacts, which may cause device-level metal shorting and impact yield rate. A targeted gate CD is determined based on a balance of device performance and yield rate. During semiconductor device manufacturing, achieving the targeted gate CD and maintaining the targeted gate CD uniformly across different IC chips and wafers is also important. Manufacturing variations may cause gate CD wafer-to-wafer (WTW) non-uniformity and within-wafer (WIW) non-uniformity. This might cause circuit defects and chip yield deterioration. Therefore, there is a need to have a gate CD measurement method to provide accurate gate CD and gate profile characterization, as well as a gate fabrication technique that provides gate profile WIW and WTW uniformity.

Transistors formed using replacement gate (or "gate-last") process and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistors (FinFETs) is used as an example to explain the concept of the present disclosure. Gate-all-around (GAA) transistors or planar transistors may also adopt the embodiments of the present disclosure.

Figure 13:
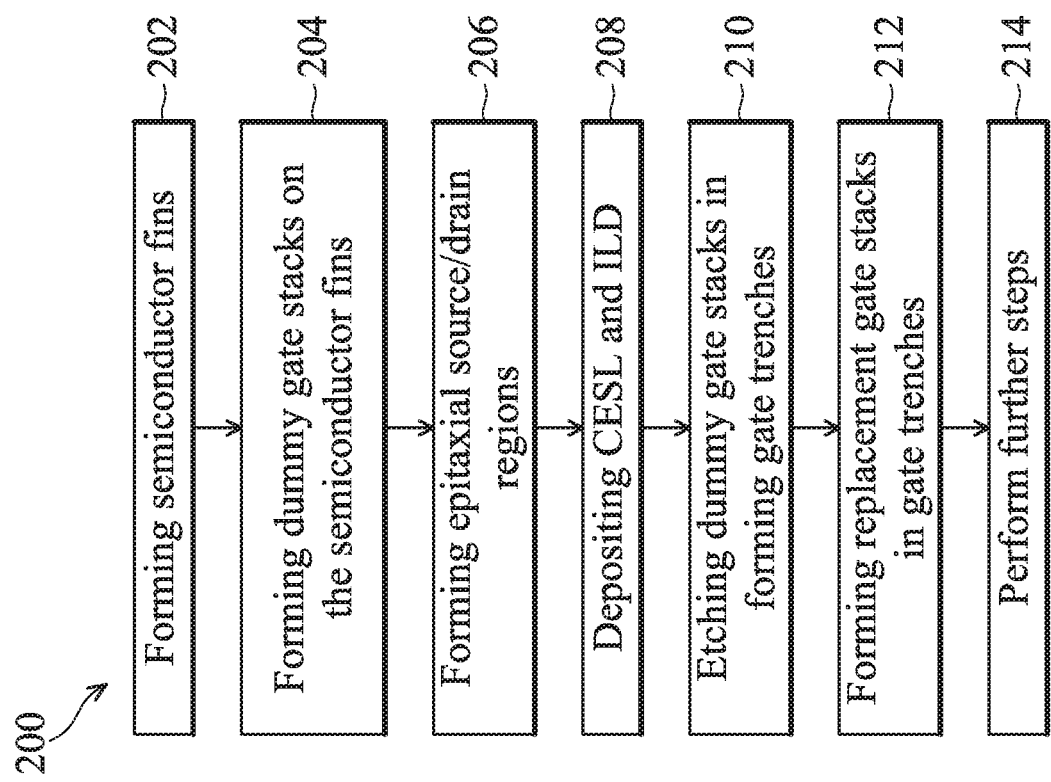
FIG. 13 shows a flow chart of a method for forming a semiconductor structure, according to aspects of the present disclosure.

FIGS. 1-6B and 8-11B illustrate perspective and cross-sectional views of intermediate stages in the formation of FinFETs in accordance with some embodiments of the present disclosure. The steps shown in FIGS. 1-6B and 8-11B are also reflected schematically in the process flow 200 as shown in FIG. 13.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some exemplary embodiments. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some exemplary embodiments, semiconductor strips 24 are formed of silicon germanium, silicon carbon, or a III-V compound semiconductor material.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Figure 2:
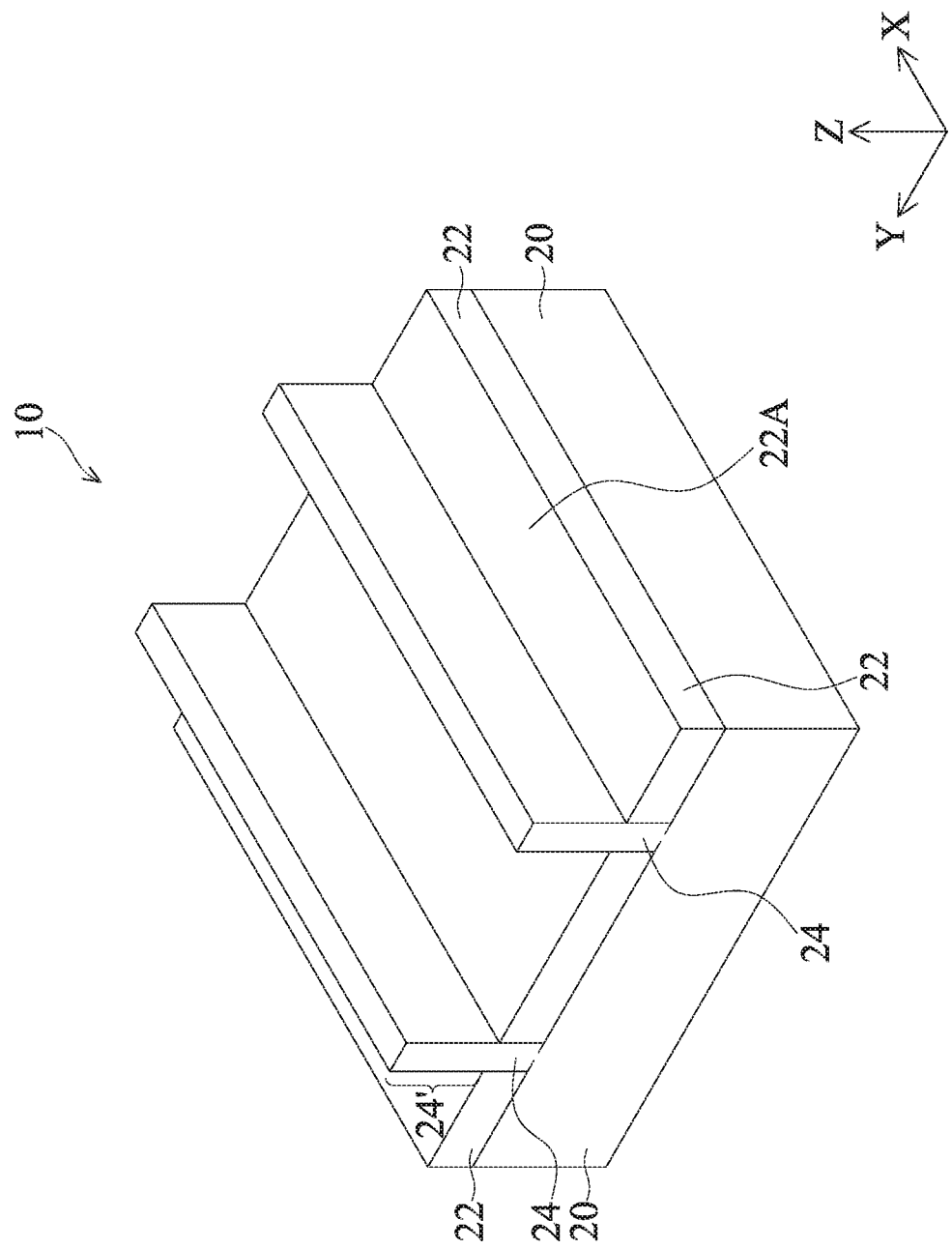

Referring to FIG. 2, STI regions 22 are recessed, so that the top portions of semiconductor strips 24 protrude higher than the top surfaces 22A of the remaining portions of STI regions 22 to form protruding fins 24'. The respective step is illustrated as step 202 in the process flow 200 as shown in FIG. 13. The etching may be performed using a dry etching process, wherein $HF_3$ and $NH_3$ are used as the etching gases. In accordance with alternative embodiments of the present disclosure, the recessing of STI regions 22 is performed using a wet etch process. The etching chemical may include HF solution, for example.

In above-illustrated exemplary embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of protruding fins 24' may also be replaced with materials different from that of substrate 20. For example, protruding fins 24' may be formed of Si, SiP, SiC, SiPC, SiGe, SiGeB, Ge, or a III-V compound semiconductor such as InP, GaAs, AlAs, InAs, InAlAs, InGaAs, or the like.

Figure 3:
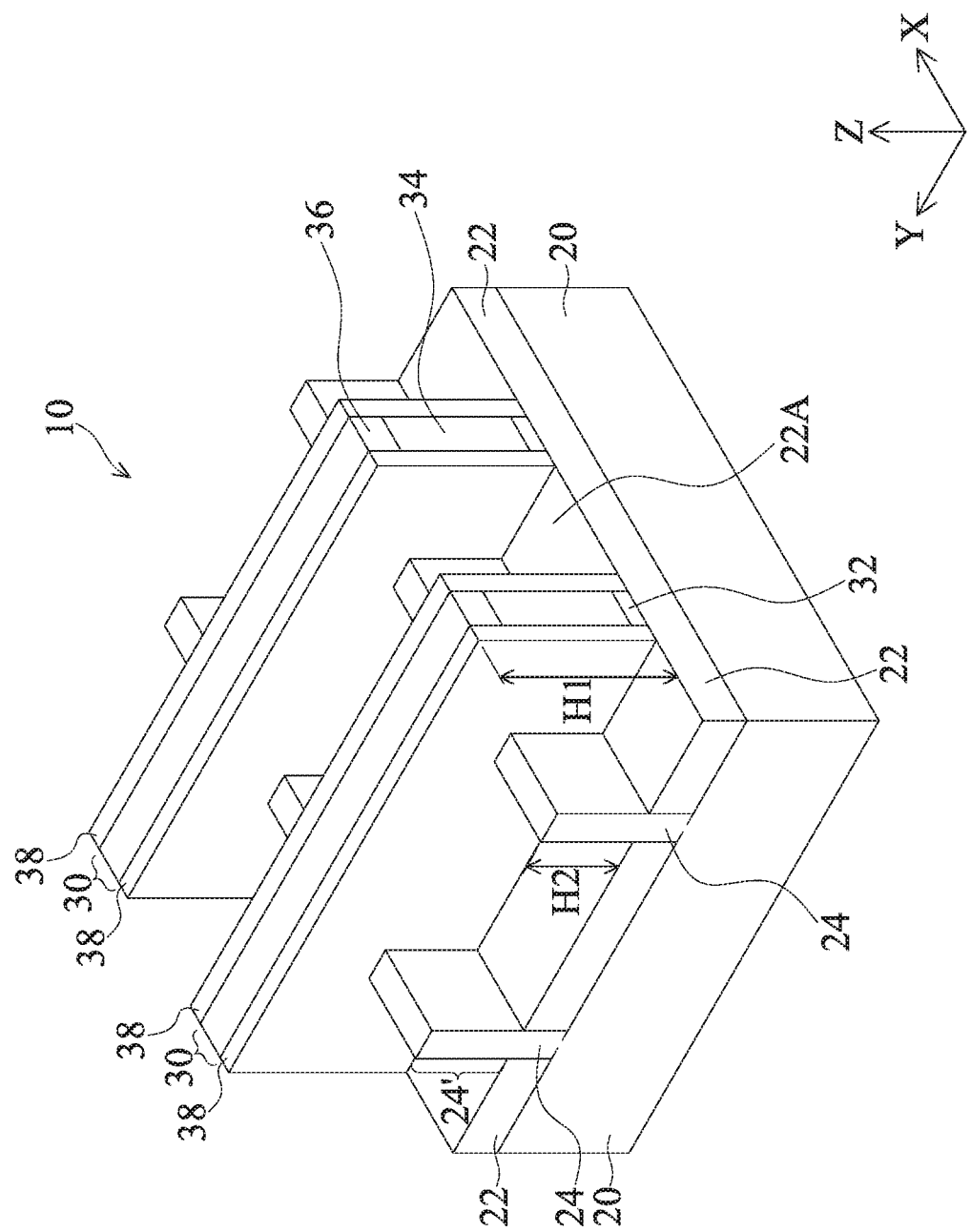

Referring to FIG. 3, dummy gate stacks 30 are formed on the top surfaces and the sidewalls of protruding fins 24'. The respective step is illustrated as step 204 in the process flow 200 as shown in FIG. 13. Dummy gate stacks 30 may include dummy gate dielectric layer 32 and dummy gate electrode layer 34 over dummy gate dielectric layer 32. Dummy gate dielectric layer 32 is formed over protruding fins 24'. Dummy gate dielectric layer 32 may be formed by thermal oxidation, CVD, sputtering, or any other methods known and used in the art for forming a dummy gate dielectric layer. In some embodiments, the dummy gate dielectric layer may be made of one or more suitable dielectric materials such as silicon oxide ($SiO_2$), silicon nitride ($Si_3N_4$), silicon oxynitride (SiON), low-k dielectrics such as carbon doped oxides, extremely low-k dielectrics such as porous carbon doped silicon dioxide, a polymer such as polyimide, the like, or a combination thereof. In other embodiments, the dummy gate dielectric layer includes dielectric materials having a high dielectric constant (k value), for example, greater than 3.9. The materials may include metal oxides such as $HfO_2$, $HfZrO_x$, $HfSiO_x$, $HfTiO_x$, $HfAlO_x$, TiN, the like, or a combination thereof. In the illustrated embodiment, dummy gate dielectric layer 32 is an oxide layer, such as silicon oxide. Dummy gate electrode layer 34 may be formed, for example, using polysilicon, and other materials may also be used. Dummy gate electrode layer 34 may be deposited by PVD, CVD, sputter deposition, or other techniques known and used in the art for depositing conductive materials. Each of dummy gate stacks 30 may also include one (or a plurality of) hard mask layer 36 over dummy gate electrode layer 34. Hard mask layer 36 may be formed of silicon nitride, silicon oxide, silicon carbo-nitride, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'. The overall height of dummy gate stack A 30 is a distance from a top surface of dummy gate stacks 30 to top surfaces 22A of the remaining portions of STI regions 22, denoted as H1. The overall height of protruding fin 24' is a distance from a top surface of protruding fins 24' to top surfaces 22A of the remaining portions of STI regions 22, denoted as H2.

Next, gate spacers 38 are formed on the sidewalls of dummy gate stacks 30. In accordance with some embodiments of the present disclosure, gate spacers 38 are formed of a dielectric material such as silicon nitride, silicon oxide, silicon carbo-nitride, silicon oxynitride, silicon oxy carbo-nitride, or the like, and may have a single-layer structure or a multi-layer structure including a plurality of dielectric layers.

Figure 4:
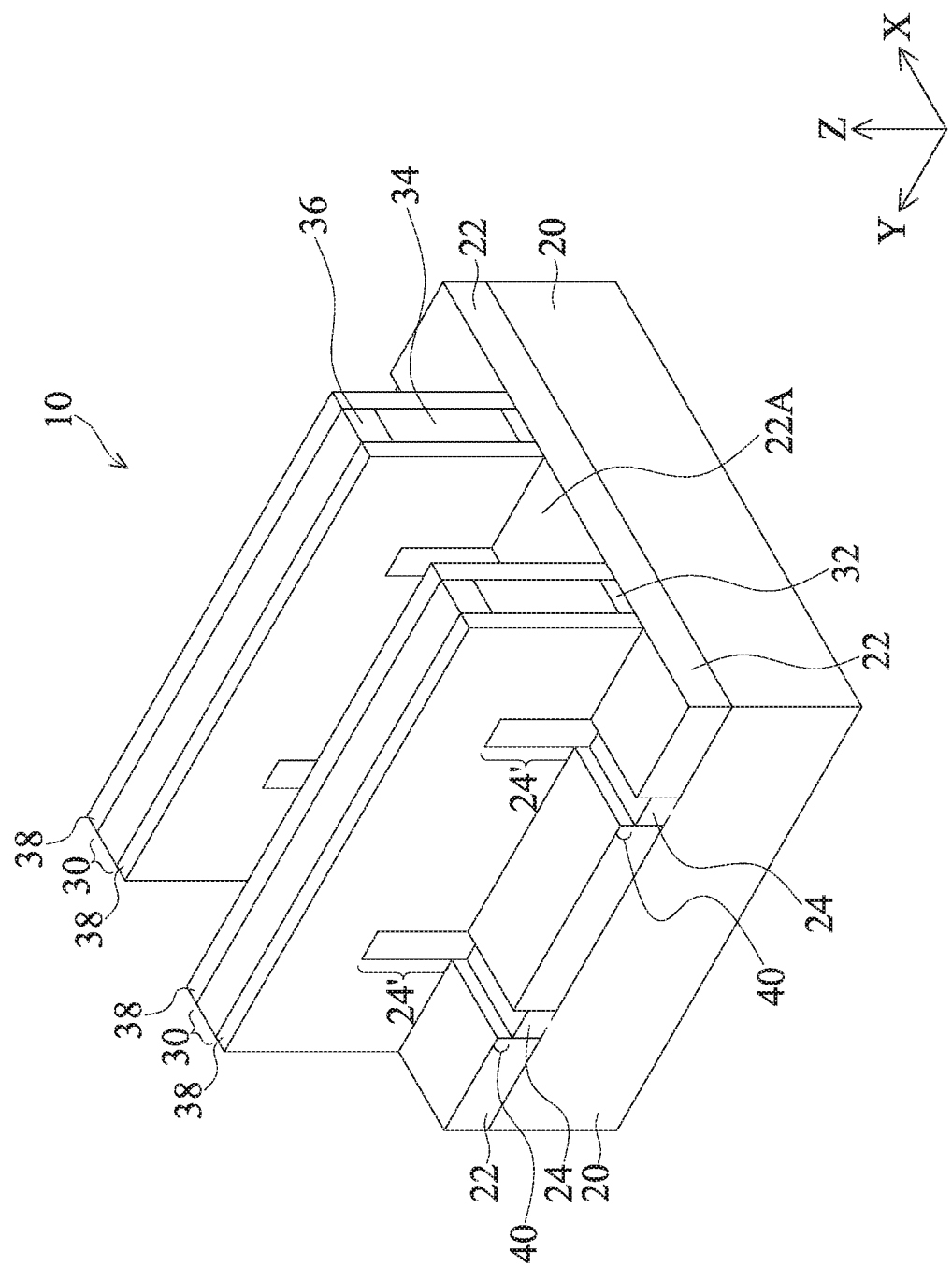

In accordance with some embodiments of the present disclosure, an etching step (referred to as source/drain recessing) is performed to etch the portions of protruding fins 24' that are not covered by dummy gate stacks 30 and gate spacers 38, resulting in the structure shown in FIG. 4. The recessing may be anisotropic, and hence the portions of fins 24' directly underlying dummy gate stacks 30 and gate spacers 38 are protected, and are not etched. The top surfaces of the recessed semiconductor strips 24 may be lower than top surfaces 22A of STI regions 22 in accordance with some embodiments. Recesses 40 are accordingly formed between STI regions 22. Recesses 40 are located on the opposite sides of dummy gate stacks 30.

Figure 5A:
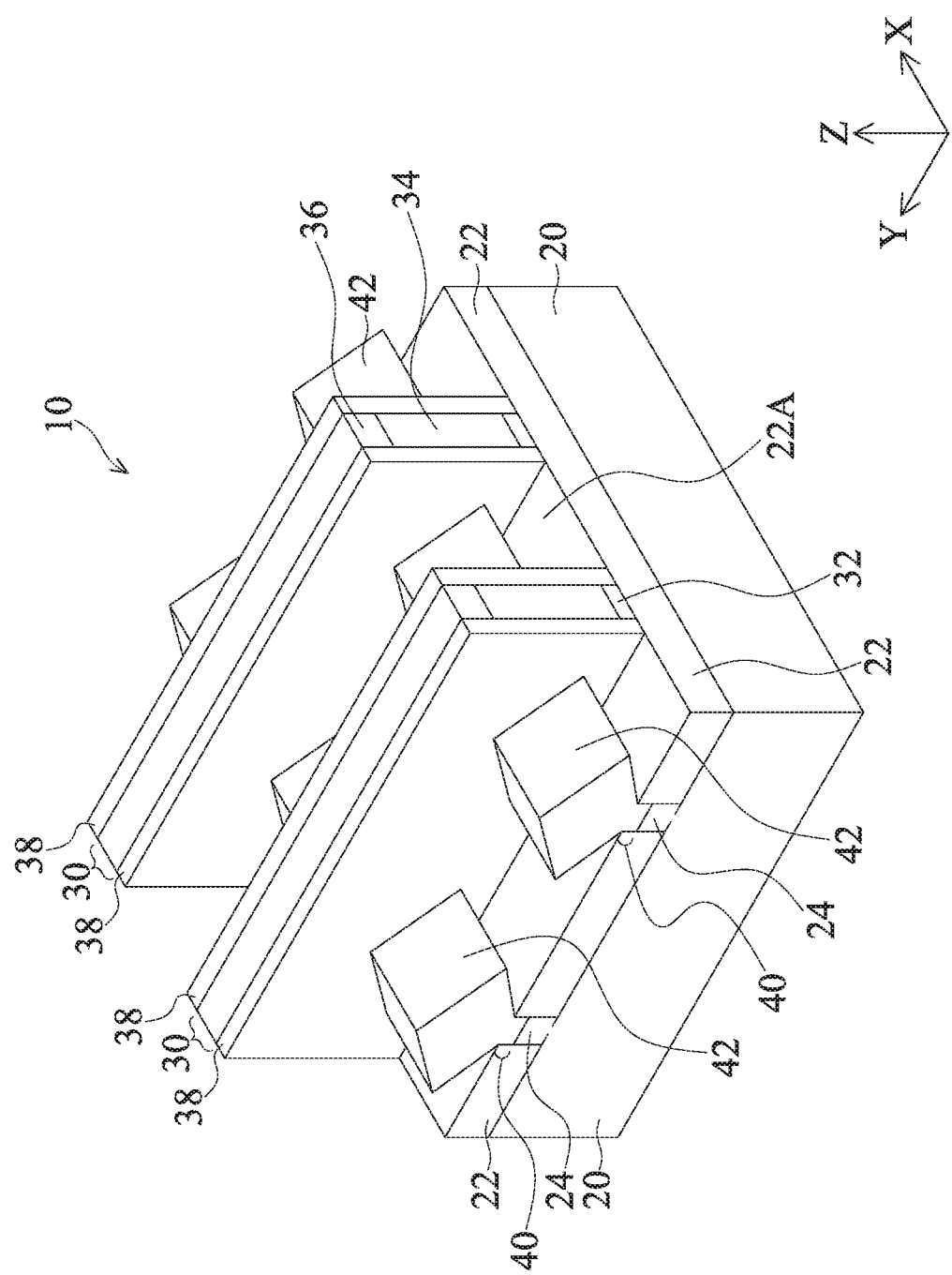

Next, epitaxy regions (source/drain regions) 42 are formed by selectively growing a semiconductor material in recesses 40, resulting in the structure in FIG. 5A. The respective step is illustrated as step 206 in the process flow 200 as shown in FIG. 13. In accordance with some exemplary embodiments, epitaxy regions 42 include silicon germanium, silicon, or silicon carbon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed.

After the epitaxy step, epitaxy regions 42 may be further implanted with a p-type or an n-type impurity to form source and drain regions, which are also denoted using reference numeral 42. In accordance with alternative embodiments of the present disclosure, the implantation step is skipped when epitaxy regions 42 are in-situ doped with the p-type or n-type impurity during the epitaxy to form source/drain regions. Epitaxy source/drain regions 42 include lower portions that are formed in STI regions 22, and upper portions that are formed over the top surfaces of STI regions 22.

Figure 5B:
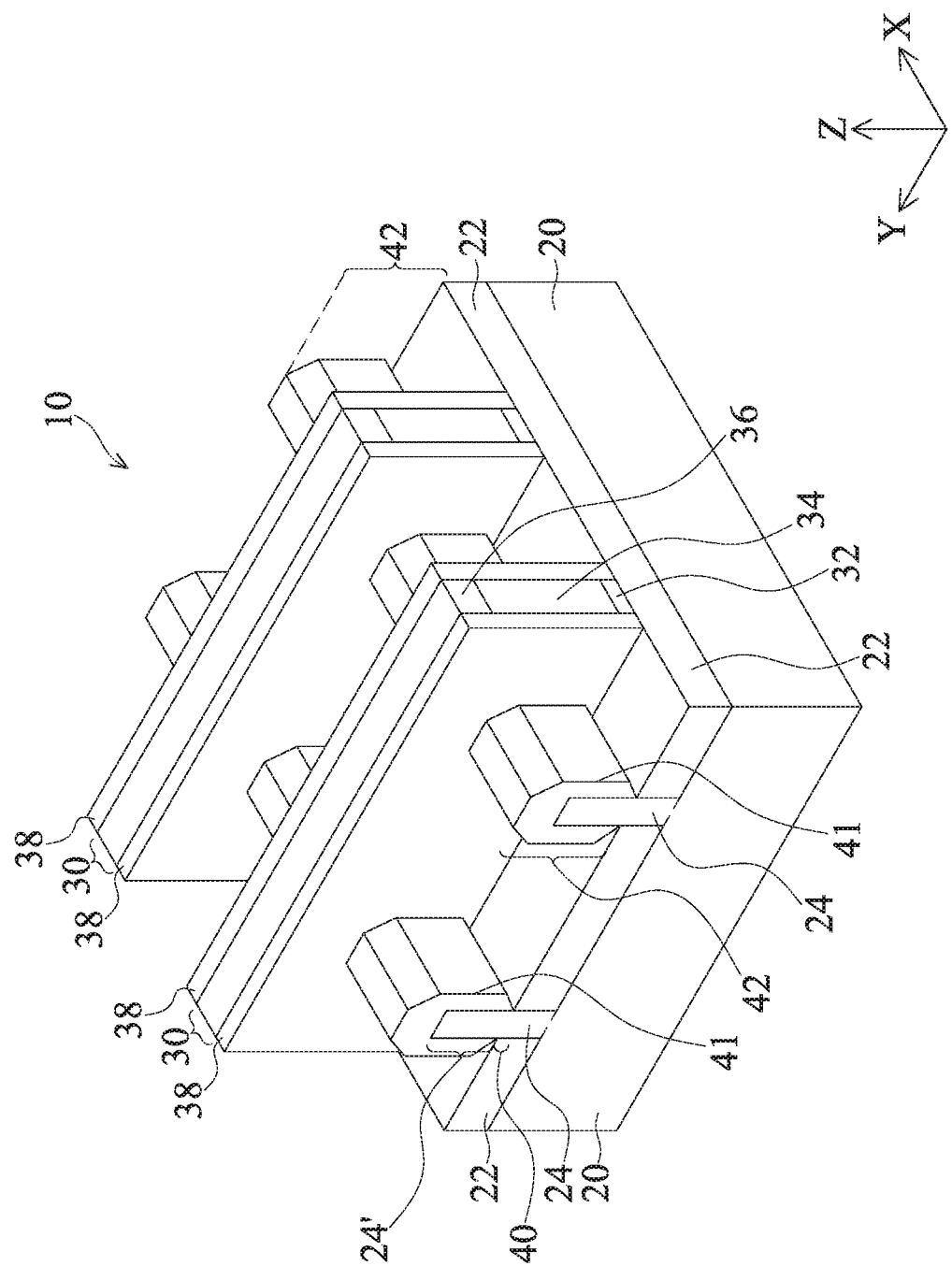

FIG. 5B illustrates the formation of cladding source/drain regions 42 in accordance with alternative embodiments of the present disclosure. In accordance with these embodiments, the protruding fins 24' as shown in FIG. 3 are not recessed, and epitaxy regions 41 are grown on protruding fins 24'. The material of epitaxy regions 41 may be similar to the material of the epitaxy semiconductor material 42 as shown in FIG. 5A, depending on whether the resulting FinFET is a p-type or an n-type FinFET. Accordingly, source/drains 42 include protruding fins 24' and the epitaxy region 41. An implantation may (or may not) be performed to implant an n-type impurity or a p-type impurity.

Figure 6A:
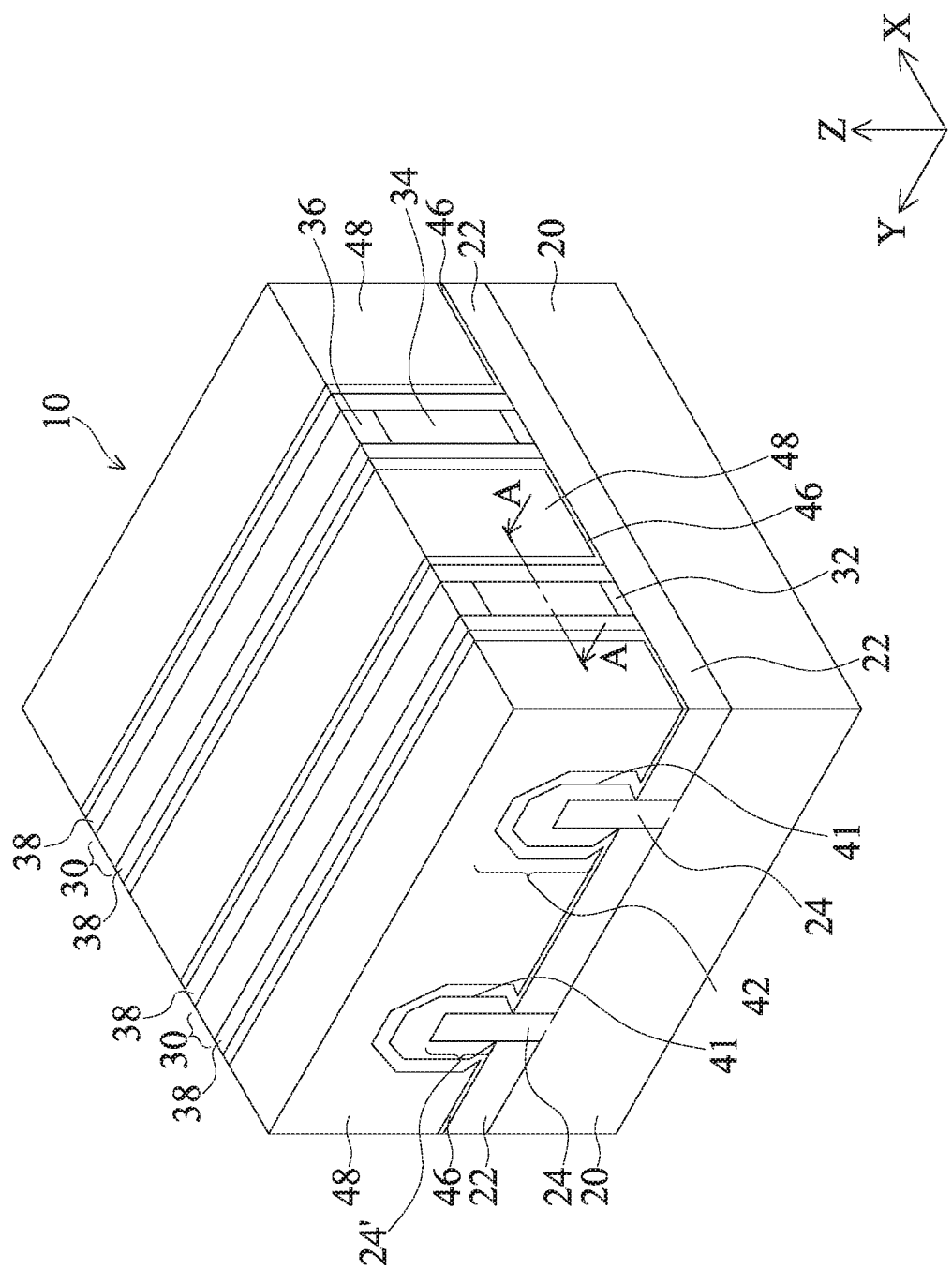

FIG. 6A illustrates a perspective view of the structure after the formation of Contact Etch Stop Layer (CESL) 46 and Inter-Layer Dielectric (ILD) 48. The respective step is illustrated as step 208 in the process flow 200 as shown in FIG. 13. CESL 46 may be formed of silicon nitride, silicon carbo-nitride, or the like. CESL 46 may be formed using a conformal deposition method such as ALD or CVD, for example. ILD 48 may include a dielectric material formed using, for example, FCVD, spin-on coating, CVD, or another deposition method. ILD 48 may also be formed of an oxygen-containing dielectric material, which may be silicon-oxide based such as Tetra Ethyl Ortho Silicate (TEOS) oxide, Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization step such as Chemical Mechanical Polish (CMP) or mechanical grinding is performed to level the top surfaces of ILD 48, dummy gate stacks 30, and gate spacers 38 with each other.

Figure 6B:
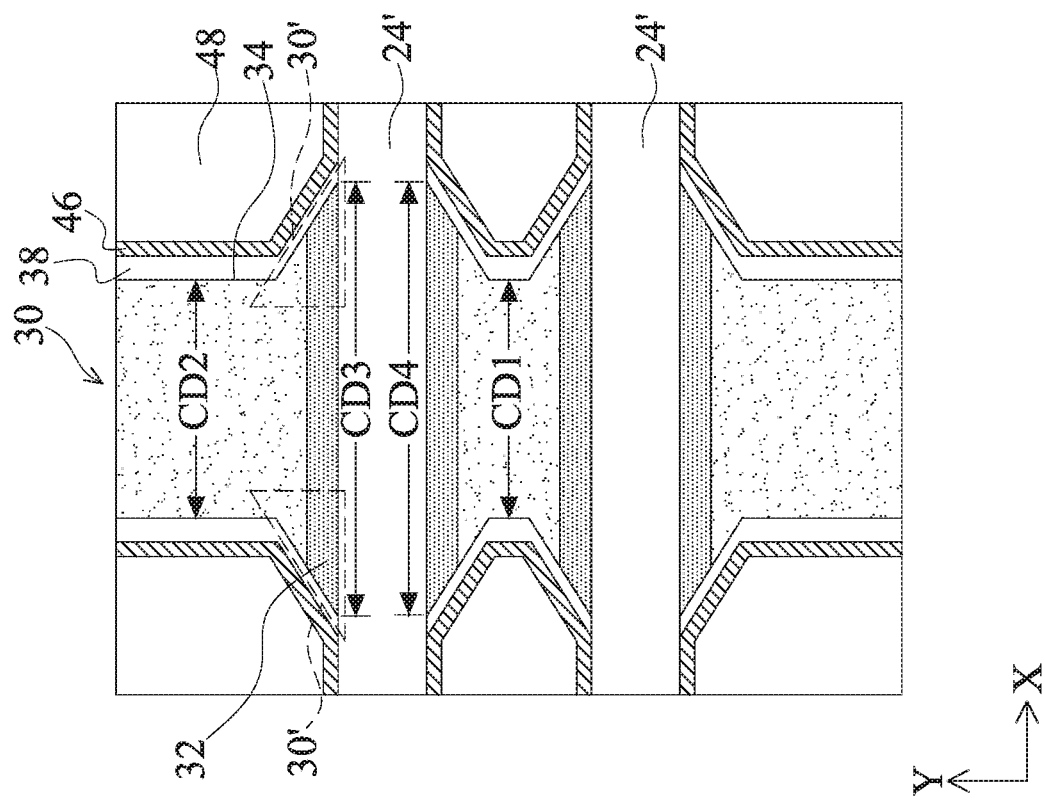

A cross-sectional view of the structure shown in FIG. 6A is illustrated in FIG. 6B. The cross-sectional view is obtained from the horizontal plane containing line A-A in FIG. 6A. As shown in FIG. 6B, one of dummy gate stacks 30 is illustrated. A gate length (measured along a direction perpendicular to the lengthwise direction of a gate stack; i.e., along X-direction in FIG. 6B) is denoted as gate critical dimension (CD). Due to process reasons such as etching effects in the formation of dummy gate stack 30, the portions of dummy gate stack 30 intersecting protruding fins 24' may be wider than other portions distant from protruding fins 24'. The widening in the portions of dummy gate stack 30 intersecting protruding fins 24' is referred to as "footing effect", and the widening portions are referred to as footing regions (or portions), as marked by portions 30'. Accordingly, a gate CD measured at different portions of dummy gate stack 30 may have different values. FIG. 6B illustrates gate CDs measured at three different regions of dummy gate stack 30, denoted as CD1-CD4. CD1 is measured at a region between two adjacent protruding fins 24', which is referred to as an "intra-fin" region. From a top view as illustrated in FIG. 6B, an "intra-fin" region usually has a necking profile between two footing portions 30'. A gate CD measured at an "intra-fin" region (i.e., CD1) may reveal the smallest gate CD value. On the other hand, CD2 is measured at a region on the other side of a protruding fin 24' that is away from the "intra-fin" region, which is referred to as an "outer-fin" region. CD3 and CD4 are measured in proximity to two edges (sidewalls) of protruding fin 24', respectively, which is referred to as an "on-fin" region. The term "in proximity to" refers to a distance less than about 2 nm or right on an edge of a protruding fin.

In addition, in Z-direction, it is possible that dummy gate stack 30 includes an upper portion with straight and vertical sidewalls, and a lower portion with slanted sidewalls. The slanted sidewalls may also be straight, or may be substantially straight with a slight curve. Gate spacers 38 may follow the profile of the sidewalls of dummy gate stack 30, and hence have slanted bottom portions. By measuring gate CDs at different heights of dummy gate stack 30, a gate profile of dummy gate stack 30 can be acquired. In various embodiments, gate CDs can be measured by state of art metrologies, such as cross-section scanning electron microscopy (SEM), Transmission electron microscopy (TEM), critical dimension scanning electron microscopy (CD-SEM). Others such as optical critical dimension (OCD), atomic force metrology (AFM), and critical dimension-atomic force metrology (CD-AFM) can also be used for measuring gate CDs.

Figure 7:
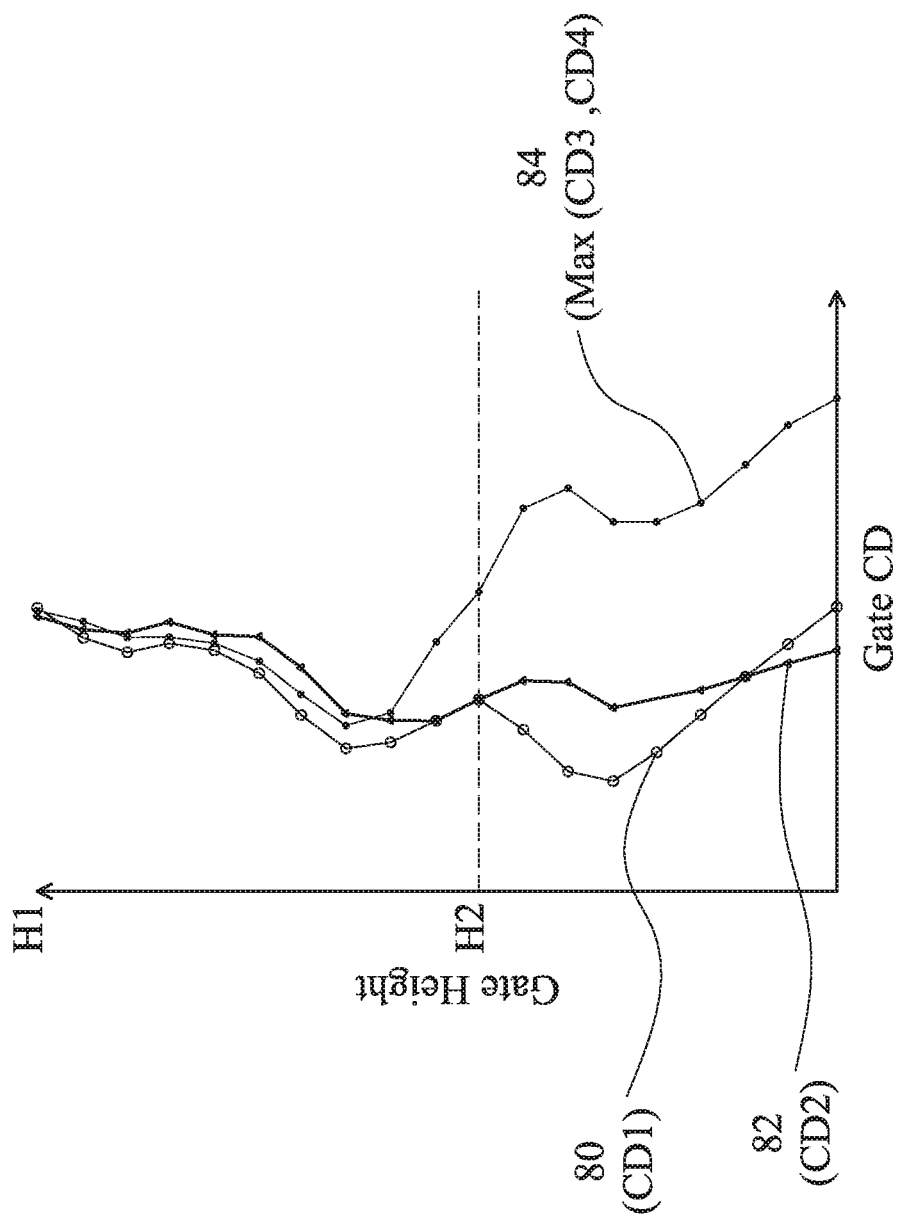
FIG. 7 illustrates gate profiles measured at different regions of a semiconductor structure, in accordance with some embodiments.

FIG. 7 illustrates a diagram of exemplary gate profiles measured at different regions of a gate stack. The diagram in FIG. 7 is general to both dummy gate stacks and replacement gate stacks (e.g., high-k metal gate stacks). The X-axis of the diagram represents gate CD value. The Y-axis of the diagram represents a height of a gate stack with reference to a top surface of STI regions. The overall height of a gate stack (H1) and overall height of a protruding fin (H2) are also marked on the Y-axis for references. Particularly, in the diagram, line 80 represents gate CDs measured at an "intra-fin" region of the gate stack (e.g., CD1 in FIG. 6), line 82 represents gate CDs measured at an "outer-fin" region of the gate stack (e.g., CD2 in FIG. 6), and line 84 represents a weighted value of two gate CDs measured at an "on-fin" region of the gate stack (e.g., CD3 and CD4 in FIG. 6). CD3 and CD4 are measured in proximity to two edges (sidewalls) of the same protruding fin, respectively. In the illustrated embodiment, a weighted value is to pick the larger value between the two gate CDs (e.g., max(CD3, CD4)). In some embodiments, a weighted value is an average of the two gate CDs (e.g., (CD3+CD4)/2). In some other embodiments, a weighted value is either one of two gate CDs (e.g., either CD3 or CD4).

Still referring to FIG. 7, gate profiles represented by lines 80, 82, and 84 are close to each other regarding portions of a gate stack that are above the fin-top of a protruding fin (>H2). It is mainly because footing regions usually exist in intersections of a gate stack and a protruding fin and do not extend into regions above the fin-top of a protruding fin. Thus, gate CDs measured in "intra-fin" "on-fin" "outer-fin" regions have substantially the same value above the fin-top of a protruding fin. As a comparison, when gate height is below the fin-top of a protruding fin (<H2), the gate profile represented by line 84 consistently shows larger gate CD values than other gate profiles at a given gate height. The difference is greater than about 8 nm, and may be in the range between about 8 nm and about 12 nm, in some embodiments. This is mainly due to the widening in the footing regions of a gate stack. Usually an after-development-inspection (ADI) examines gate CD at an "intra-fin" region, which often reveals the smallest gate CD value at a necking area between two adjacent footing portions. However, as IC technologies progress towards smaller technology nodes (for example, 20 nm, 16 nm, 10 nm, 7 nm, and below), transistor performance influenced by extra gate CDs at footing portions is no longer omittable with decreasing gate dimensions. As shown in FIG. 7, gate CDs measured at "intra-fin" or "outer-fin" regions do not capture the current drive introduced by footing portions and becomes not so accurate in transistor characterization. Instead, gate CD measured at "on-fin" regions gives a more accurate representation of gate length for characterizing transistor performance.

After forming the respective structure as shown in FIGS. 6A and 6B, next, dummy gate stacks 30 are replaced with replacement gate stacks, which include metal gate layer and replacement gate dielectric layer. In accordance with some embodiments of the present disclosure, the replacement includes etching dummy gate stacks 30, which include hard mask layer 36, dummy gate electrode layer 34, and dummy gate dielectric layer 32 in one or more etching steps, resulting in openings (also referred to as gate trenches) to be formed between opposite portions of gate spacers 38. The respective step is illustrated as step 210 in the process flow 200 as shown in FIG. 13.

Figure 8:
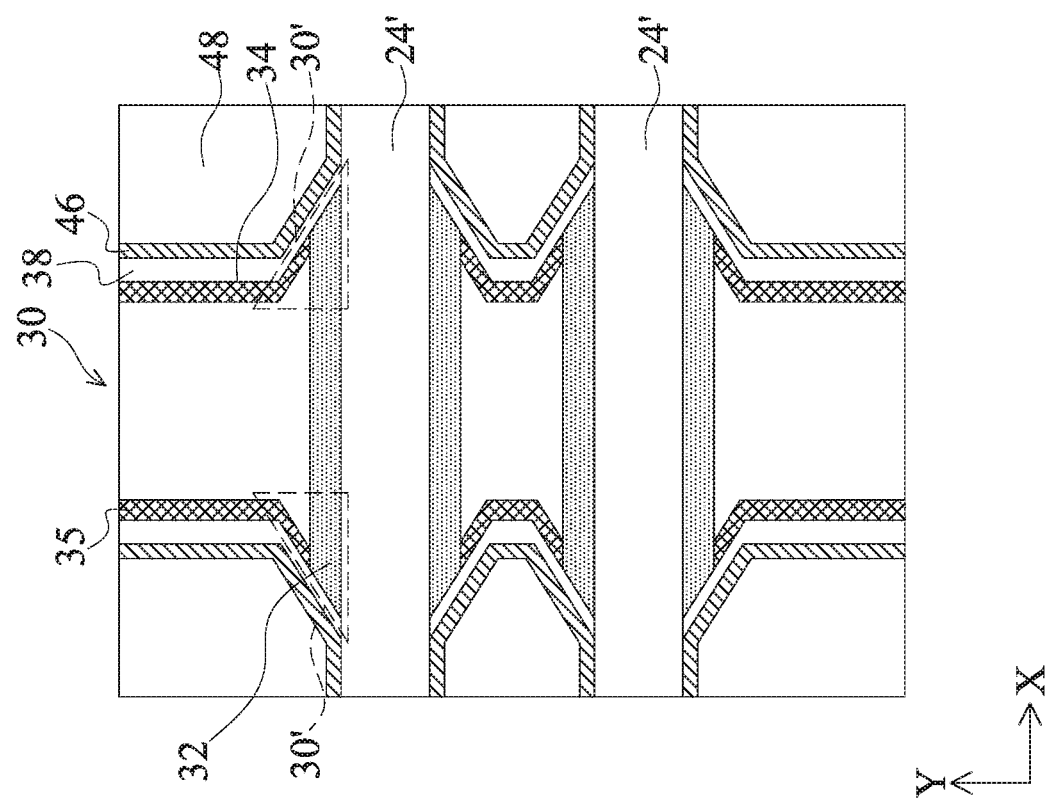

In some embodiments, the removal of dummy gate stacks 30 include two or more etching steps, each targeting at specific material compositions in dummy gate stacks 30. For example, a first etching step may have high etching selectivity tuned to the dummy gate electrode layer 34 with substantially no (or minimum) etching loss occurred to gate spacers 38 and dummy gate dielectric layer 32. In accordance with some embodiments of the present disclosure, the first etching step may be an anisotropic etching process using process gases selected from, and not limited to, $Cl_2$, $BCl_3$, Ar, $CH_4$, $CF_4$, and combinations thereof. The etching may be performed with a pressure in the range between about 3 mTorr and about 10 mTorr. An RF power is applied in the main etching, and the RF power may be in the range between about 500 Watts and about 900 Watts. A bias voltage smaller than about 150 Watts may also be applied. During the removal of gate electrode layer 34, a native oxide layer 35 may be formed on the exposed surfaces of gate spacers 38. Native oxide layer 35 may have a thickness ranging from about 1 nm to about 3 nm. The resultant structure after the first etching step is shown in FIG. 8.

Figure 9B:
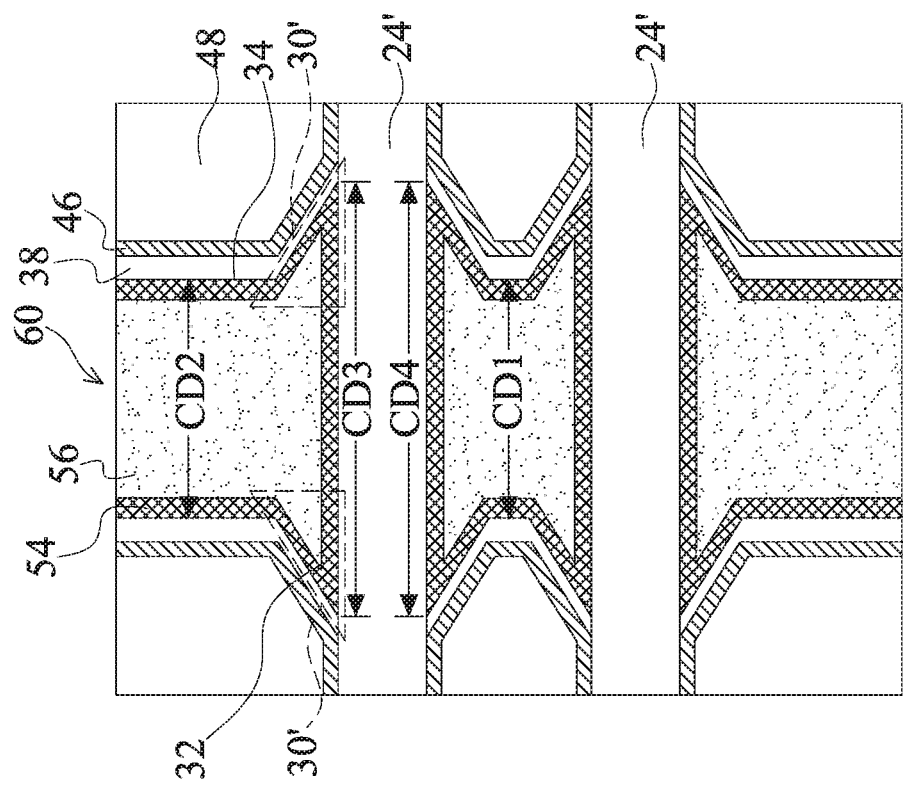
Figure 9A:
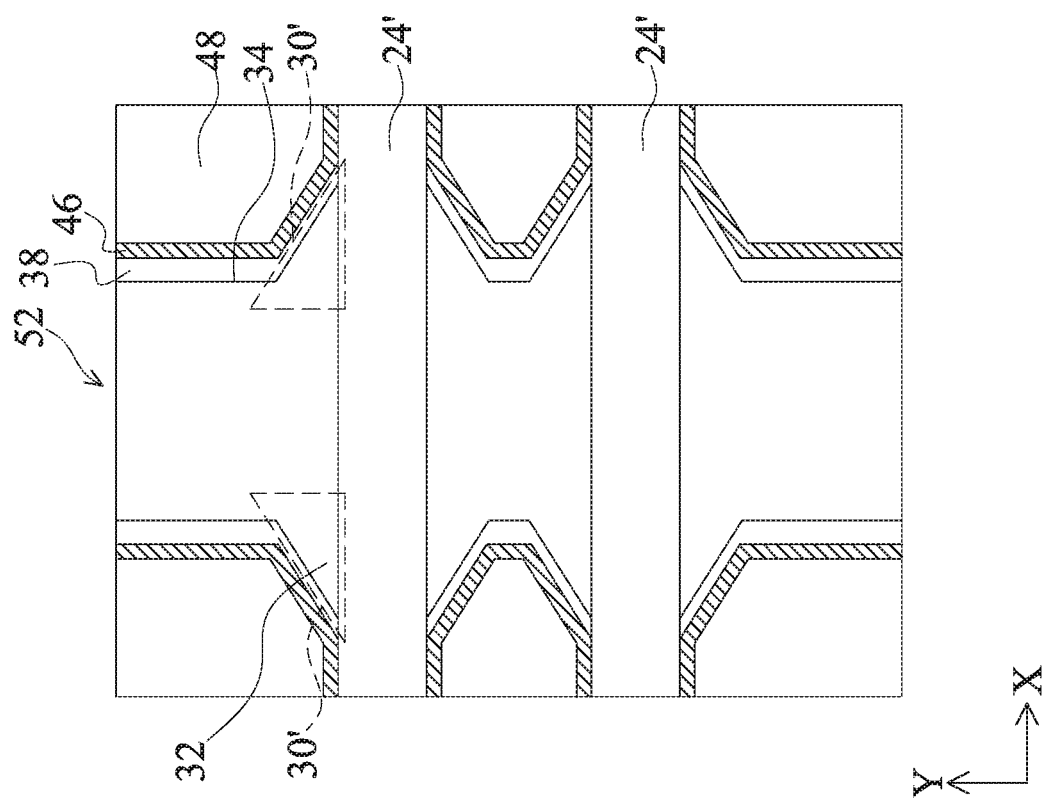

A second etching step may have high etching selectivity tuned to dummy gate dielectric layer 32 (e.g., an oxide layer) and native oxide layer 35 with substantially no (or minimum) etching loss occurred to gate spacers 38 and protruding fins 24'. In accordance with some embodiments of the present disclosure, the second etching step may be a dry etching process, a wet etching process, or other suitable etching process. In some embodiments, the second etching step uses a chemical solution, which may be diluted HF. The etching may be performed at a temperature in the range between about 20° C. and about 30° C., and the etching time may be in the range between about 30 seconds and about 60 seconds. The weight ratio of water to HF in the diluted HF is greater than about 1500:1, and may be in the range between about 1500:1 and about 2500:1. By adjusting recipe of an etching process, such as parameters in second etching step including etchant concentration, etchant flow rate, etching temperature, etching duration, or different etchants, the etching strength can be adjusted. Since dummy gate dielectric layer 32 in corners of footing regions 30' are relatively hard to reach by an etchant, by selecting less strong etching recipes, residue of dummy gate dielectric layer 32 may remain in corners of footing regions 30'. The residue of dummy gate dielectric layer 32 results in different gate trench openings at "on-fin" regions. FIGS. 9A, 10A, 11A illustrate three exemplary resultant structures after relatively strong, mild, and relatively weak etching recipes, respectively. FIGS. 9B, 10B, 11B, illustrate three exemplary resultant structures after high-k metal gate stacks 60 (also referred to as replacement gate stacks 60) are deposited in respective gate trenches 52 in FIGS. 9A, 10A, 11A. The respective step is illustrated as step 212 in process flow 200 as shown in FIG. 13. Subsequently, process flow 200 may proceed to step 214 to form various features and regions known in the art. For example, subsequent processing may form contact openings, contact metal, as well as various contacts/vias/lines and multilayers interconnect features (e.g., metal layers and interlayer dielectrics) configured to connect the various features to form a functional circuit.

Still referring to FIGS. 9B, 10B, 11B, high-k metal gate stacks 60 include a high-k dielectric layer 54 and a conductive layer 56. The high-k metal gate stacks 60 may further include an interfacial layer (now shown) between the high-k dielectric layer 54 and protruding fins 24'. The interfacial layer may be formed using chemical oxidation, thermal oxidation, ALD, CVD, and/or other suitable methods. High-k dielectric layer 54 may include one or more high-k dielectric materials (or one or more layers of high-k dielectric materials), such as hafnium silicon oxide (HfSiO), hafnium oxide (HfO$_2$), alumina (Al$_2$O$_3$), zirconium oxide (ZrO$_2$), lanthanum oxide (La$_2$O$_3$), titanium oxide (TiO$_2$), yttrium oxide (Y$_2$O$_3$), strontium titanate (SrTiO$_3$), or a combination thereof. High-k dielectric layer 54 may be deposited using CVD, ALD and/or other suitable methods. Conductive layer 56 includes one or more metal layers, such as work function metal layer(s), conductive barrier layer(s), and metal fill layer(s). The work function metal layer may be a p-type or an n-type work function layer depending on the type (PFET or NFET) of the device. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The metal fill layer may include aluminum (Al), tungsten (W), cobalt (Co), and/or other suitable materials. Conductive layer 56 may be deposited using methods such as CVD, PVD, plating, and/or other suitable processes.

As illustrated in comparisons of three exemplary structures in FIGS. 9A-11B, by measuring gate CDs at "on-fin" regions, it provides an opportunity to fine tune gate CDs by controlling etching of dummy gate dielectric layer 32 in footing regions 30'. In FIGS. 9A and 9B, by the complete removal of dummy gate dielectric layer 32, the replacement gate CDs in different regions (e.g., "intra-fin" region or "outer-fin" region) substantially equal the dummy gate CDs in respective regions. In some embodiments, replacement gate CDs may even be larger than dummy gate CDs (e.g., about 1 nm to about 2 nm larger) due to etch loss occurred to gate spacers 38 during an over etching. In FIGS. 10A and 10B, with a mild etching recipe, some residue of dummy gate dielectric layer 32 is hard to remove from corner space and remain in footing regions 30', resulting in reduced replacement gate CDs at "on-fin" regions. However, gate CD measurements at other regions, such as "intra-fin" and "outer-fin" regions, would not capture replacement gate CD reduction, because the removal of native oxide layer 35 from open space is insensitive to etching strength. In FIGS. 11A and 11B, with a relatively weak etching recipe, majority of dummy gate dielectric layer 32 remains in footing regions 30', resulting in even further reduction in replacement gate CDs at "on-fin" regions. Similarly, since native oxide layer 35 is substantially removed outside of footing regions 30', gate CD measurements at "intra-fin" and "outer-fin" regions, would not capture such replacement gate CD reduction.

Figure 12:
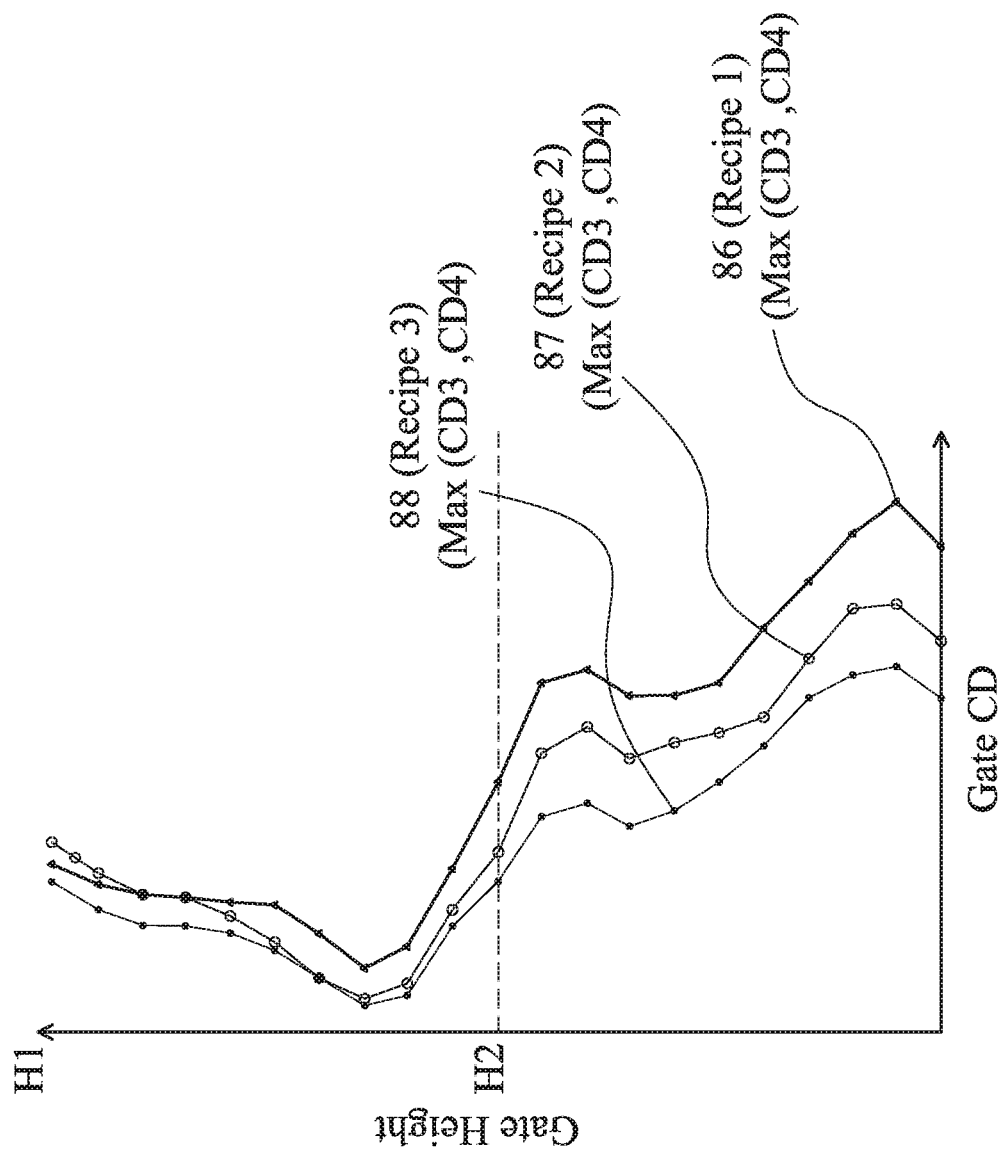
FIG. 12 illustrates gate profiles of a semiconductor structure as a function of various etching recipes, in accordance with some embodiments.

The relationship of replacement gate CDs and different etching recipes is represented by gate profiles shown in FIG. 12. Particularly, FIG. 12 illustrates an exemplary diagram of gate profiles measured at "on-fin" regions with three different etching recipes for dummy gate stack removal. The gate CD is based on weighted value of two gate CDs at an "on-fin" region (e.g., CD3 and CD4 in FIGS. 9B, 10B, 11B). In the illustrated embodiment, a weighted value is to pick the larger value between the two gate CDs (e.g., max(CD3, CD4)). In some embodiments, a weighted value is an average of the two gate CDs (e.g., (CD3+CD4)/2). In some other embodiments, a weighted value is either one of two gate CDs (e.g., either CD3 or CD4). In FIG. 12, when gate height is above the fin-top of protruding fin 24' (>H2), gate profiles represented by lines 86, 87, and 88 are close to each other. It is mainly because footing regions usually exist in intersections of dummy gate stacks and protruding fins and do not extend into portions above the fin-top of protruding fin 24'. Therefore, dummy gate dielectric layer 32 and native oxide layer 35 both are substantially removed by three etching recipes. As a comparison, when gate height is below the fin-top of protruding fin 24' (<H2), the gate profile represented by line 86, which is formed with a relative strong etching recipe, shows larger gate CDs than gate profiles formed by other etching recipes, due to substantial removal of dummy gate dielectric layer 32 from footing regions 30'. The gate profile represented by line 86 is also closest to dummy gate profile represented by line 84 in FIG. 7. The gate profile represented by line 87, which is formed with a mild etching recipe, shows reduced gate CDs compared with line 86, due to some residue of dummy gate dielectric layer 32 remaining in footing regions 30'. The gate profile represented by line 88, which is formed with a relatively weak etching recipe, shows the smallest gate CDs compared with lines 86 and 87, due to majority of dummy gate dielectric layer 32 remaining in footing regions 30'.

Referring to FIGS. 7 and 12 collectively, it has been found that there is a correlation between an "on-fin" gate CD measurement and a series of replacement gate CDs depending on etching recipes for gate trench formation. It is to be noted that in the example shown in FIG. 12, the recipes vary mainly in dummy gate dielectric layer removal stage. However, the recipes including both dummy gate electrode layer and dummy gate dielectric layer removal can also be used for correlation. Further, the correlation is shown in FIGS. 7 and 12 in the form of graphs. The correlation can also be represented in other forms such as lookup tables and equations. The correlation may be pre-measured and derived using a set of sample devices. The correlation may include a plurality of gate profiles and a plurality of series of replacement gate profiles, where each series of replacement gate profiles corresponds to a particular dummy gate profile. In production, based on an "on-fin" gate CD measurement at a particular gate height on a target wafer, a gate profile (e.g., line 84 in FIG. 7) with that "on-fin" gate CD at that particular gate height can be identified, and the series of corresponding replacement gate profiles (e.g., lines 86, 86, 88 in FIG. 12) can be retrieved. Subsequently, an etching recipe can be picked to achieve a desired gate CD or correct an otherwise deviated gate CD.

Figure 14:
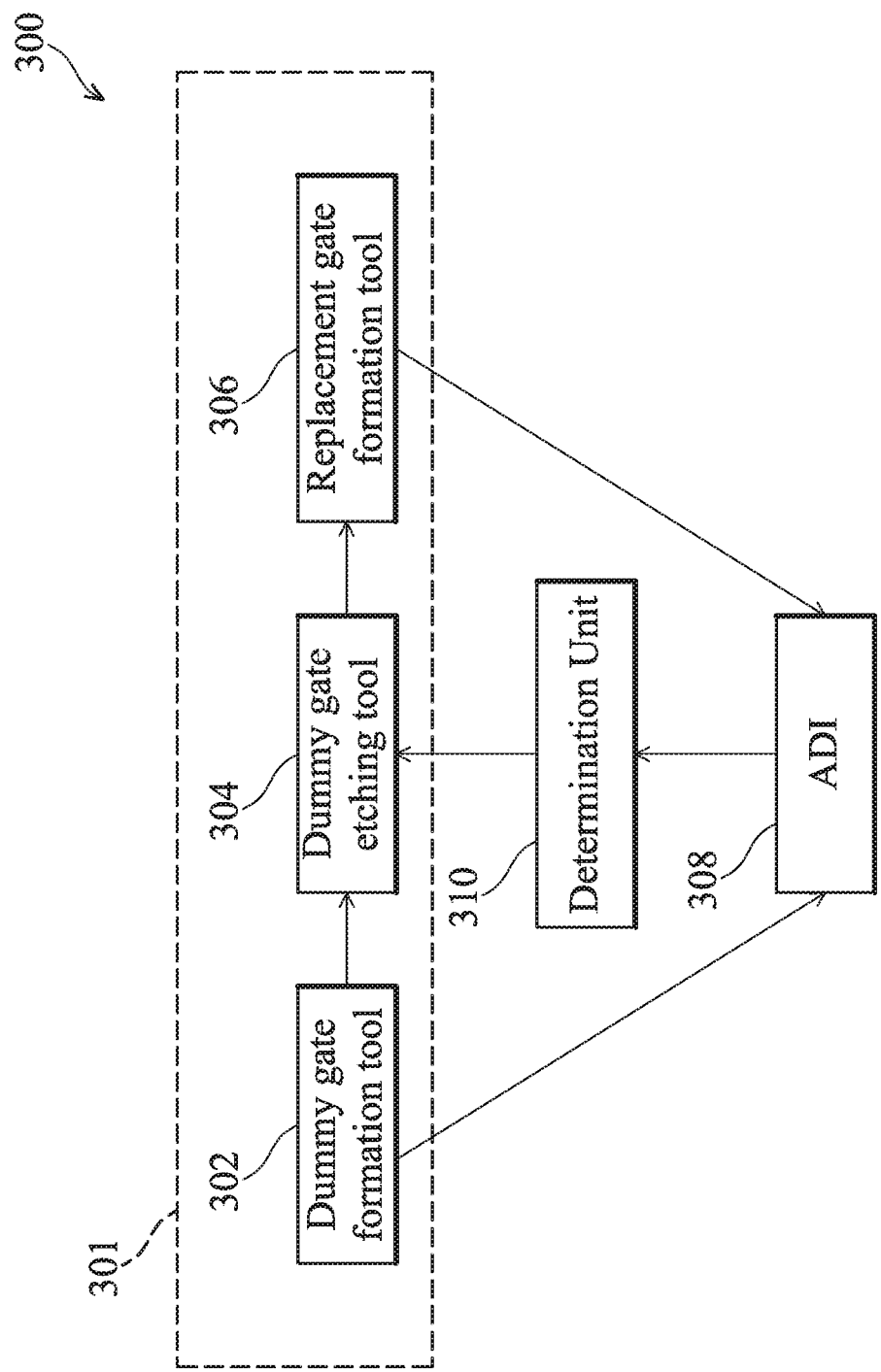
FIG. 14 illustrates a gate formation control system and its workflow, according to aspects of the present disclosure.

FIG. 14 illustrates a gate formation control system 300 and its workflow, which may include sub-systems such as a device dimension measuring tool (e.g., after-development-inspection (ADI)) 308, a determination unit 310, and a gate formation tool 301, which may further include a dummy gate formation tool 302, a dummy gate etching tool 304, and a replacement gate formation tool 306. Dummy gate formation tool 302 and replacement gate formation tool 306 may share some apparatus, such as an ALD deposition apparatus in some embodiments. As discussed above, gate CDs can be fine-tuned by adjusting etching recipe in gate trench formation, during which dummy gate electrode layer and dummy gate dielectric layer are removed. Various parameters may be used to determine an optimal etching recipe. An exemplary workflow of determining the optimal etching recipe is as following: initially, a correlation between "on-fin" gate CD and a series of corresponding replacement gate CD is acquired from sample devices (or sample wafer); subsequently, an "on-fin" gate CD is measured on a target device (or target wafer) and an etching recipe is picked based on the earlier acquired correlation.

To acquire the correlation, after dummy gate stacks are patterned and formed by dummy gate formation tool 302, which corresponds to step 204 in the process flow 200 as shown in FIG. 13, device dimension measuring tool 308 performs an after-development-inspection to measure "on-fin" gate CDs at different gate heights to acquire gate profiles of dummy gate stacks. "On-fin" gate CDs can be measured by equipment such as such as cross-section scanning electron microscopy (SEM), Transmission electron microscopy (TEM), or critical dimension scanning electron microscopy (CD-SEM). Other equipment such as optical critical dimension (OCD), atomic force metrology (AFM) and critical dimension-atomic force metrology (CD-AFM) can also be used for measuring "on-fin" gate CDs. The after-development-inspection is not necessary to perform right after step 204 in the process flow 200. In some embodiments, the after-development-inspection may be performed after step 206 in the process flow 200, which forms epitaxial source/drain regions. In some embodiments, the after-development-inspection may be performed after step 208 in the process flow 200, which deposits CESL and ILD. Gate CD measurements are stored and processed by determination unit 310. A graph similar to FIG. 7 with one or more "on-fin" lines 84 (no need to have lines 80/82 which are not at "on-fin" regions) may be generated by determination unit 310. Subsequently, dummy gate etching tool 304 etches the dummy gate stacks by applying a series of etching recipes, which corresponds to step 210 in the process flow 200 as shown in FIG. 13. Each etching recipe results in a corresponding gate trench opening after the dummy gate stack removal. In some embodiments, there is at least one parameter different among the series of etching recipes, such as etchant concentration, etchant flow rate, etching temperature, etching duration, and types of etchants. In a particular example, the difference among the series of etching recipes is etching duration.

After the gate trenches are formed, replacement gate formation tool 306 forms replacement gate stacks in the gate trenches, which corresponds to step 212 in the process flow 200 as shown in FIG. 13. Device dimension measuring tool 308 performs another after-development-inspection to measure "on-fin" gate CDs at different gate heights to acquire gate profiles of replacement gate stacks associated with respective etching recipes. Gate CD measurements are stored and processed by determination unit 310. One or more graphs similar to FIG. 12 may be generated by determination unit 310, each graph corresponding to one "on-fin" line 84 stored earlier by the determination unit 310. In some embodiments, determination unit 310 also derives an optimal recipe for each gate CD value.

To determine an etching recipe to apply on a target wafer, after dummy gate stacks are patterned and formed on the target wafer by dummy gate formation tool 302, device dimension measuring tool 308 performs an after-development-inspection to measure one or more "on-fin" gate CDs at one or more gate heights. Determination unit 310 receives from device dimension measuring tool 308 the "on-fin" gate CD and looks up which "on-fin" line 84 has that gate CD value at the given gate height. Once the sample "on-fin" line 84 is determined, the corresponding correlation of "on-fin" gate profiles in association with different etching recipes is retrieved. Based on a target gate CD, determination unit 310 determines whether a deviation from standard gate CD has happened and pick an etching recipe to correct the deviation and feed it forward to dummy gate etching tool 304. A standard gate CD may be a pre-determined value, which balances a need for larger gate drive (i.e., larger gate CD) and an avoidance of gate source/drain metal short (i.e., smaller gate CD). Subsequently, dummy gate etching tool 304 etches the dummy gate stack to form gate trenches with given etching recipe and replacement gate formation tool 306 deposits replacement gate stack in the gate trenches.

Although in the discussion above, the correlation between the "on-fin" gate CDs and etching recipes is pre-measured and construed, the correlation may be dynamically construed by gate formation control system 300. For example, when a first wafer with an "on-fin" gate CD of a dummy gate stack is manufactured, a default etching recipe is used. After replacement gate stacks are formed, device dimension measuring tool 308 obtains an "on-fin" gate CD of a replacement gate stack. If the gate CD is deviated from a predetermined value, when the second wafer is loaded for manufacturing, the etching recipe will be adjusted. For example, if the measured gate CD of replacement gate stack of previous wafer is too large, the etching recipe will be tuned weaker; if the measured gate CD of replacement gate stack of previous wafer is too small, the etching recipe will be tuned stronger. After an adequate number of wafers are measured on-the-fly, the correlation between the "on-fin" gate CDs and etching recipes can be determined, and the correlation can be used for subsequent device formation. Another advantage of the embodiment of the present disclosure is that gate profile errors caused by other factors may also be corrected by the etching recipe fine-tuning, even if the mechanisms of those factors are not known to the designers, providing the effects of those factors are not random and persist from wafer to wafer.

In some embodiments, device dimension measuring tool 308 may also measure gate CDs at "intra-fin" regions and determination unit 310 also takes "intra-fin" gate CDs in its decision making. It is because gate CDs usually has its minimum value at "intra-fin" regions. A small gate CD increases difficulties in work function metal filling in gate trenches during a replacement gate process. Determination unit 310 may consider "on-fin" gate CDs with "intra-fin" gate CDs together. If "intra-fin" gate CD is close to or even smaller than a pre-determined threshold, determination unit 310 may nonetheless pick a strong etching recipe for over etching to ensure minimum gate CD is at least maintained at "intra-fin" regions.

Figure 15:
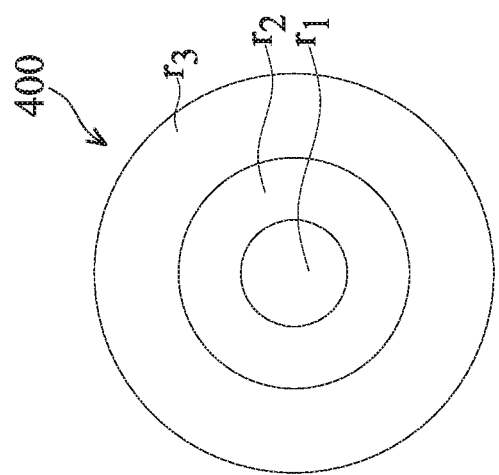
FIG. 15 illustrates a schematic view of within-wafer non-uniformity on a wafer, according to aspects of the present disclosure.

Wafer-to-wafer process variations can be mitigated by previously discussed embodiments. Other variations causing non-uniformity within a wafer can also be mitigated. FIG. 15 illustrates a schematic view of a wafer 400 wherein "on-fin" gate CDs have within-wafer (WIW) non-uniformity. In a typical case, from the center of the wafer 400 to the outer edge, the chips having equal distances to the center have similar gate CDs. Therefore, rings such as r1, r2, and r3 can be used to symbolize different gate CDs. For example, chips in r1 have larger gate CDs than chips in r2, and chips in r2 have larger gate CDs than chips in r3. The within-wafer non-uniformity of gate CDs will cause within-wafer non-uniformity of gate profiles.

Figure 16A:
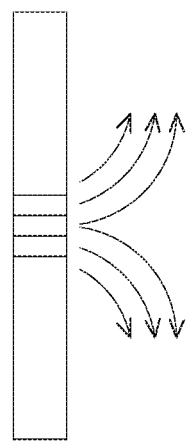
FIGS. 16A and 16B illustrate a method of improving within-wafer uniformity, according to aspects of the present disclosure.
Figure 16B:
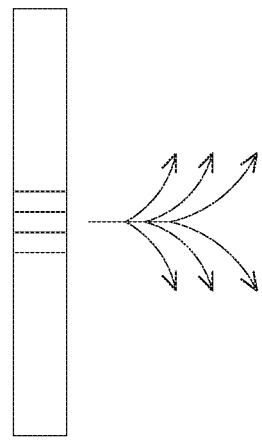

FIGS. 16A and 16B illustrate a method of improving within-wafer uniformity by using tunable etchant injection. Flow rate of etchant is a parameter affecting etching rate of an etching recipe. Since the etching gases are typically symmetrically injected into the reaction chamber, the etching rate on a wafer can also be illustrated as a ring-like structure, as shown in FIG. 15, with each ring having a similar etching rate. The etching gases can be injected into the chamber in center mode or edge mode. In the center mode, as illustrated in FIG. 16A, gases are injected into the reaction chamber mainly from a central point, preferably toward the center of the wafer. The chips closer and/or facing the center thus will have higher etching rates, while other chips will have lower etching rates. In the edge mode, as illustrated in FIG. 16B, gases are injected into the reaction chamber from more distributed locations that are away from the center. When switched from center mode to edge mode, the etching rate at the center of the chip decreases, and the etching rate at the edge of the chip increases.

Therefore, if after-development-inspection has revealed that there exists within-wafer non-uniformity of "on-fin" gate CDs, tunable gas injection can be used. In one embodiment, depending on the difference of "on-fin" gate CDs at the center and at the edge, an appropriate gas injection mode, which is either the center mode or edge mode, is adopted. In furtherance of the embodiment, a combination of center mode and edge mode, in which etching gases are injected into the chamber from both the center and the distributed locations simultaneously, can be used. For example, if the "on-fin" gate CDs at the center are greater than at the edge, the profile at the center will have greater footing effect than at the edge. Therefore, less centered gas injection (and/or more edge gas injection) can be used to lower etching rate at the center. This will mitigate gate footing effect more at the center of the wafer than at the edge, and thus form a wafer with more uniform gate profiles. Conversely, if the "on-fin" gate CDs at the center are smaller than at the edge, more centered gas injection (and/or less edge gas injection) can be used to increase etching rate at the center.

Although not intended to be limiting, one or more embodiments of the present disclosure provide many benefits to a semiconductor device and the formation thereof. For example, embodiments of the present disclosure provide a simple and cost-effective system and methodology for gate formation control without a significant reduction in production throughput. In the present disclosure, gate critical dimension measured near or on edges of a fin on which a gate stack is engaging provides a more accurate representation of gate length for characterizing transistor performance. Furthermore, the workflow of gate formation can be easily integrated into existing semiconductor fabrication processes.

In one exemplary aspect, the present disclosure is directed to a method of controlling gate formation of a semiconductor device. The method includes acquiring a correlation between gate critical dimensions (CDs) and etching recipes for forming gate trenches; measuring a gate CD on a target wafer; determining an etching recipe based on the correction and the measured gate CD; and performing an etching process on the target wafer to form a gate trench with the determined etching recipe. In some embodiments, the measuring of the gate CD on the target wafer includes measuring at least one gate length at a location in proximity to an edge of a fin. In some embodiments, the measuring of the gate CD on the target wafer includes measuring a first gate length at a first location in proximity to a first edge of a fin; measuring a second gate length at a second location in proximity to a second edge of the fin; and calculating a weighted value of the first and second gate lengths as the measured gate CD. In some embodiments, the weighted value is a larger value of the first and second gate lengths. In some embodiments, the weighted value is an average of the first and second gate lengths. In some embodiments, the gate CD is measured at a location below a fin. In some embodiments, the acquiring of the correlation includes forming dummy gate stacks on wafers; measuring the gate CDs of the dummy gate stacks; etching the dummy gate stacks with the etching recipes, thereby forming the gate trenches; forming replacement gate stacks in the gate trenches; and measuring the gate CDs of the replacement gate stacks. In some embodiments, the etching recipes are different in etching duration. In some embodiments, the gate CD is a first gate CD measured at a first location in proximity to an edge of a first fin, and the method further includes measuring a second gate CD at a second location between the first fin and a second fin, wherein the determining of the etching recipe includes comparing the second gate CD to a pre-determined minimum gate CD value.

In another exemplary aspect, the present disclosure is directed to a method of controlling gate formation of a semiconductor device. The method includes measuring a gate length of a dummy gate stack on a target wafer; picking an etching recipe based on the measured gate length; etching the dummy gate stack with the etching recipe, thereby forming a gate trench; and forming a metal gate stack in the gate trench. In some embodiments, the gate length is measured in a location of the dummy gate stack that is in proximity to a sidewall of a fin engaged by the dummy gate stack. In some embodiments, the measuring of the gate length includes measuring first and second gate lengths in two locations of the dummy gate stack, wherein the two locations sandwich a fin engaged by the dummy gate stack; and selecting a weighted value of the first and second gate lengths as the measured gate length. In some embodiments, the weighted value is a larger value of the first and second gate lengths. In some embodiments, the weighted value is an average of the first and second gate lengths. In some embodiments, the gate length is measured at a height of the dummy gate stack that is lower than a fin engaged by the dummy gate stack. In some embodiments, the etching recipe is picked from a series of etching recipes that are different in etching duration.

In yet another exemplary aspect, the present disclosure is directed to a system for manufacturing semiconductor devices. The system includes a gate formation tool configured to form gate structures; a device dimension measuring tool configured to measure gate critical dimensions (CDs) of the gate structures; and a determination unit configured to read from the device dimension measuring tool the gate CDs and feed forward one of a series of etching recipes based on the gate CDs to the gate formation tool for a gate etching process performed by the gate formation tool. In some embodiments, the device dimension measuring tool measures the gate CDs at locations that are on edges of fins engaged by the gate structures. In some embodiments, the locations are below the fins. In some embodiments, the determination unit stores a correlation between the gate CDs and the series of etching recipes.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of controlling gate formation of a semiconductor device, comprising:
   acquiring a correlation between gate critical dimensions (CDs) and etching recipes for forming gate trenches;
   forming a dummy gate stack on a target wafer;
   measuring a gate CD of the dummy gate stack on the target wafer;
   determining an etching recipe based on the correction and the measured gate CD;
   performing an etching process on the target wafer to form a gate trench by partially removing the dummy gate stack with the determined etching recipe, wherein a portion of the dummy gate stack remains on the target wafer after the etching process, and a size of the portion of the dummy gate stack is controlled by the determined etching recipe; and
   forming a replacement gate stack in the gate trench, wherein the replacement gate stack is in physical contact with the portion of the dummy gate stack.

2. The method of claim 1, wherein the measuring of the gate CD on the target wafer includes measuring at least one gate length of the dummy gate stack at a location in proximity to an edge of a fin.

3. The method of claim 1, wherein the measuring of the gate CD on the target wafer includes:
   measuring a first gate length of the dummy gate stack at a first location in proximity to a first edge of a fin;
   measuring a second gate length of the dummy gate stack at a second location in proximity to a second edge of the fin; and
   calculating a weighted value of the first and second gate lengths as the measured gate CD.

4. The method of claim 3, wherein the weighted value is a larger value of the first and second gate lengths.

5. The method of claim 3, wherein the weighted value is an average of the first and second gate lengths.

6. The method of claim 1, wherein the gate CD is measured at a location below a fin.

7. The method of claim 1, wherein the acquiring of the correlation includes:
   forming dummy gate stacks on wafers;
   measuring the gate CDs of the dummy gate stacks;
   etching the dummy gate stacks with the etching recipes, thereby forming the gate trenches;
   forming replacement gate stacks in the gate trenches; and
   measuring the gate CDs of the replacement gate stacks.

8. The method of claim 1, wherein the etching recipes are different in etching duration.

9. The method of claim 1, wherein the gate CD is a first gate CD measured at a first location in proximity to an edge of a first fin, further comprising:
   measuring a second gate CD at a second location between the first fin and a second fin,
   wherein the determining of the etching recipe includes comparing the second gate CD to a pre-determined minimum gate CD value.

10. A method of controlling gate formation of a semiconductor device, comprising:
    measuring a gate length of a dummy gate stack on a target wafer, wherein the gate length is measured at a height of the dummy gate stack that is lower than a fin engaged by the dummy gate stack;
    picking an etching recipe based on the measured gate length;
    etching the dummy gate stack with the etching recipe, thereby forming a gate trench; and
    forming a metal gate stack in the gate trench.

11. The method of claim 10, wherein the gate length is measured in a location of the dummy gate stack that is in proximity to a sidewall of a fin engaged by the dummy gate stack.

12. The method of claim 10, wherein the measuring of the gate length includes:
    measuring first and second gate lengths in two locations of the dummy gate stack, wherein the two locations sandwich a fin engaged by the dummy gate stack; and
    selecting a weighted value of the first and second gate lengths as the measured gate length.

13. The method of claim 12, wherein the weighted value is a larger value of the first and second gate lengths.

14. The method of claim 13, wherein the weighted value is an average of the first and second gate lengths.

15. The method of claim 10, wherein the etching recipe is picked from a series of etching recipes that are different in etching duration.

16. A system for manufacturing semiconductor devices, comprising:
    a gate formation tool configured to form sacrificial gate structures and replacement gate structures;
    a device dimension measuring tool configured to measure gate critical dimensions (CDs) of the sacrificial gate structures; and
    a determination unit configured to read from the device dimension measuring tool the gate CDs and feed forward one of a series of etching recipes based on the gate CDs to the gate formation tool for a gate etching process performed by the gate formation tool,
    wherein the gate etching process is configured to partially remove the sacrificial gate structures to form gate trenches for filling the replacement gate structures therein, a portion of the sacrificial gate structures remains exposed in the gate trenches after the gate etching process, and the series of etching recipes differ in a size of the portion of the sacrificial gate structures.

17. The system of claim 16, wherein the device dimension measuring tool measures the gate CDs at locations that are on edges of fins engaged by the gate structures.

18. The system of claim 17, wherein the locations are below the fins.

19. The system of claim 16, wherein the determination unit stores a correlation between the gate CDs and the series of etching recipes.

20. The method of claim 1, wherein the portion of the dummy gate stack remaining on the target wafer after the etching process belongs to a dummy gate dielectric layer.

* * * * *